United States Patent
Sim

(10) Patent No.: US 6,424,577 B2
(45) Date of Patent: Jul. 23, 2002

(54) SENSE AMPLIFIER CIRCUIT FOR USE IN A SEMICONDUCTOR MEMORY DEVICE

(75) Inventor: Jae-Yoon Sim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/814,414

(22) Filed: Mar. 21, 2001

(30) Foreign Application Priority Data

Mar. 21, 2000 (KR) .............................................. 00-14297

(51) Int. Cl.[7] ................................................ G11C 7/00
(52) U.S. Cl. .................... 365/189.05; 365/205; 365/207
(58) Field of Search ................................. 365/205, 207, 365/189.05, 189.01

(56) References Cited

U.S. PATENT DOCUMENTS 5,557,582 A * 9/1996 Kawamoto ............. 365/189.05
5,654,927 A * 8/1997 Lee ........................ 365/189.05
5,661,693 A * 8/1997 Akioka et al. ......... 365/189.05
6,058,059 A * 5/2000 Huang et al. .......... 365/189.05

* cited by examiner

*Primary Examiner*—Hoai V. Ho
(74) *Attorney, Agent, or Firm*—Marger Johnson & McCollom, P.C.

(57) ABSTRACT

An input/output sense amplifier circuit of a semiconductor memory device is disclosed which comprises a current sense amplifier, a voltage sense amplifier and a latch circuit. The latch circuit includes a first differential amplifier for receiving the differential signals from the voltage sense amplifier; a second differential amplifier for receiving the differential signals from the voltage sense amplifier; and a gain varying circuit coupled between output terminals of the first and second differential amplifiers and setting a voltage gain of each of the first and second differential amplifiers that varies in response to the latch signal. By this configuration, a time normally required to be provided to the latch signal is obviated, thus reducing lead time of the memory device.

4 Claims, 4 Drawing Sheets

SENSE AMPLIFIER CIRCUIT FOR USE IN A SEMICONDUCTOR MEMORY DEVICE

This application claims priority upon Korean Patent Application No. 2000-14297, filed on Mar. 21, 2000, the contents of which are herein incorporated by reference in their entirety.

FIELD OF THE INVENTION

The present invention is related to a semiconductor memory device, and, more particular, an input/output sense amplifier circuit that is used in a dynamic random access memory (hereinafter, referred to as "DRAM") device.

BACKGROUND OF THE INVENTION

A semiconductor memory device, particularly a DRAM device, includes an array of memory cells arranged in a matrix of plural rows and plural columns and circuits for accessing memory cells and transferring data read out from the memory cells to the exterior. As is well known, a transfer path connecting a memory cell to an external region includes a pair of bit lines BLn and BLnB associated with a memory cell MC, a pair of input/output lines IOi and IOiB corresponding to the bit line of the pair, and a pair of data input/output lines DIOj and DIOjB corresponding to the input/output lines of the pair, all of which are illustrated in FIG. 1.

In a concrete way, the input/output line pair IOi and IOiB transfers cell data loaded on the bit line pair to an input/output multiplexer 12 through transistors T1 and T2 (or a column pass gate circuit), which are selected by a column selection line CSL. To the input/output multiplexer 12 (although not shown in the figure) are connected plural input/output line pairs corresponding to the pair of data input/output lines DIOj and DIOjB. That is, one input/output multiplexer 12 connects one of plural pairs of input/output lines with the pair of data input/output lines DIOj and DIOjB, which transfer cell data through the input/output multiplexer 12 to a data input/output sense amplifier circuit 20. Since the size of a bit line sense amplifier 24 is small and input/output line loading and data input/output line loading are very large, an input/output sense amplifier circuit 20 is used to amplify a signal again at an end of the data input/output line pair DIOj and DIOjB.

Generally, an amplifier, which is used for an amplification of input/output signals in a memory device, is classified into a current sense type and a voltage sense type. Considering an operating characteristic, an amplifier of the voltage sense type (hereinafter, referred to as "a voltage sense amplifier") has slower response speed than an amplifier of the current sense type (referred to as "a current sense amplifier"). In other words, since the voltage sense amplifier amplifies a signal so as to have a large voltage swing, it takes much time for a signal transition between states. On the other hand, since the current sense amplifier amplifies a signal so as to have a small voltage swing, it takes a short time for a signal transition between states as compared with the voltage sense amplifier.

Continuing to refer to FIG. 1, the input/output sense amplifier circuit 20 consists of a current sense amplifier 14, a voltage sense amplifier 16 and a latch circuit 18. The current sense amplifier 14 having a rapid operation speed amplifies data signals (or differential signals of different levels) on the data input/output lines DIOj and DIOjB, and the voltage sense amplifier 16 again amplifies the data signals CSA and CSAB from the current sense amplifier 14. The latch circuit 18 converts voltage levels of data signals DIF and DIFB from the voltage sense amplifier into CMOS levels, and transfers data signals DOUT and DOUTB of the CMOS levels to an output buffer circuit 22. FIG. 2 is a detailed circuit diagram of the input/output sense amplifier circuit 20 and the output buffer circuit 22.

Referring to FIG. 2, the current sense amplifier 14 and the voltage sense amplifier 16 are activated when a signal "IOSAE" is at a logic high level. The current sense amplifier 14 consists of two PMOS transistors MP1 and MP2 and three NMOS transistors MN1, MN2 and MN3 connected as illustrated in FIG. 2. Current sense amplifier 14 senses and amplifies signals on the data input/output lines DIOj and DIOjB. The voltage sense amplifier 16 consists of two differential amplifiers, each of which comprises two PMOS transistors and three NMOS transistors connected as illustrated in the figure. The voltage sense amplifier 16 receives data signals CSA and CSAB from the current sense amplifier 14, and amplifies voltage levels of the received data signals CSA and CSAB to output data signals DIF and DIFB having amplified voltage levels. The latch circuit 18 converts the voltage levels of the data signals DIF and DIFB into CMOS levels, using four PMOS transistors MP7, MP8, MP9 and MP10 and three NMOS transistors MN9, MN10 and MN11 connected as illustrated in the figure.

In operation, if the signal IOSAE transits from a logic low level to a logic high level, the current sense amplifier 14 and the voltage sense amplifier 16 of the input/output sense amplifier circuit 20 are simultaneously activated. Data signals transferred to the data input/output lines DIOj and DIOjB are sensed and amplified by the current sense amplifier 14, and the data signal CSA and CSAB thus amplified are transferred to the voltage sense amplifier 16. The voltage sense amplifier 16 amplifies the data signals CSA and CSAB from the current sense amplifier 14. Among data signals DIF and DIFB amplified by the voltage sense amplifier 16, one having a logic high level has a voltage level of about 1.5V. The latch circuit 18 is inactivated when a signal LAT is at a logic low level. At this time, output terminals DOUT and DOUTB thereof are precharged with the same voltage VDD through the PMOS transistors MP9 and MP10. The latch circuit 18 is activated at a logic high level of the signal LAT to latch output signals DIF and DIFB of the voltage sense amplifier 16. At this time, among the output signals DOUT and DOUTB of the latch circuit, one having a logic high level has a CMOS level, i.e. a power supply voltage VDD level.

In the conventional input/output sense amplifier circuit 20, as the signals DOUT and DOUTB from the latch circuit 18 are outputted relatively rapidly, read time of the DRAM device is reduced. That is, the read time (or an access time from column address) tAA thereof is shortened. However, in the case of establishing a low-to-high transition point of time too rapidly, previously outputted data signals (i.e. output signals of the voltage sense amplifier that are outdated) are supplied as input signals of the latch circuit 18. This will be referred to as an invalid sensing operation. As illustrated in FIG. 2, the cross-coupled PMOS transistors MP7 and MP8 of the latch circuit 18 continue to maintain a latched value.

In a case where invalid data are applied to the latch circuit 18, the cross-coupled PMOS transistors MP7 and MP8 latch the invalid data. Since the latched invalid data have to be flipped into currently inputted valid data, much time is taken to output the valid data. In order to secure a stable operation of the latch circuit 18, therefore, there is given a predetermined time margin (refer to FIG. 4, Tmargin) at a low-to-high transition point of time of the signal LAT applied to the latch circuit 18. It means that the read time tAA of the DRAM device is limited by the low-to-high transition point of time (or an activation point of time) of the signal LAT.

SUMMARY OF THE INVENTION

It is therefore an object of the invention to provide a semiconductor memory device being capable of reducing read time.

It is another object of the invention to provide an input/output sense amplifier circuit of a semiconductor memory device with a latch circuit, the amplifier circuit having a variable voltage gain. This and other objects, advantages and features of the present invention are provided by a dynamic random access memory device, which comprises at least one pair of bit lines; a pair of input/output (I/O) lines corresponding to the bit lines of the pair; and an I/O sense amplifier circuit coupled to the I/O lines of the pair. The I/O sense amplifier circuit comprises a current sense amplifier for sensing a current differential between the input/output lines to output differential signals; a voltage sense amplifier for amplifying voltages of the differential signals from the current sense amplifier; and a latch circuit for latching the differential signals from the voltage sense amplifier in response to a latch signal, wherein the latch circuit includes a first differential amplifier for receiving the differential signals from the voltage sense amplifier; a second differential amplifier for receiving the differential signals from the voltage sense amplifier; and gain control means coupled between output terminals of the first and second differential amplifiers, the gain control means setting a voltage gain of each of the first and second differential amplifiers that varies in response to the latch signal.

In one embodiment, the gain control means comprises a first resistive element having one end coupled to the output terminal of the first differential amplifier; a second resistive element having one end coupled to the output terminal of the second differential amplifier; and a switch transistor coupled between the other ends of the first and second resistive elements, the switch transistor being switched on and off according to a logic level of the latch signal.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

Figure 2:
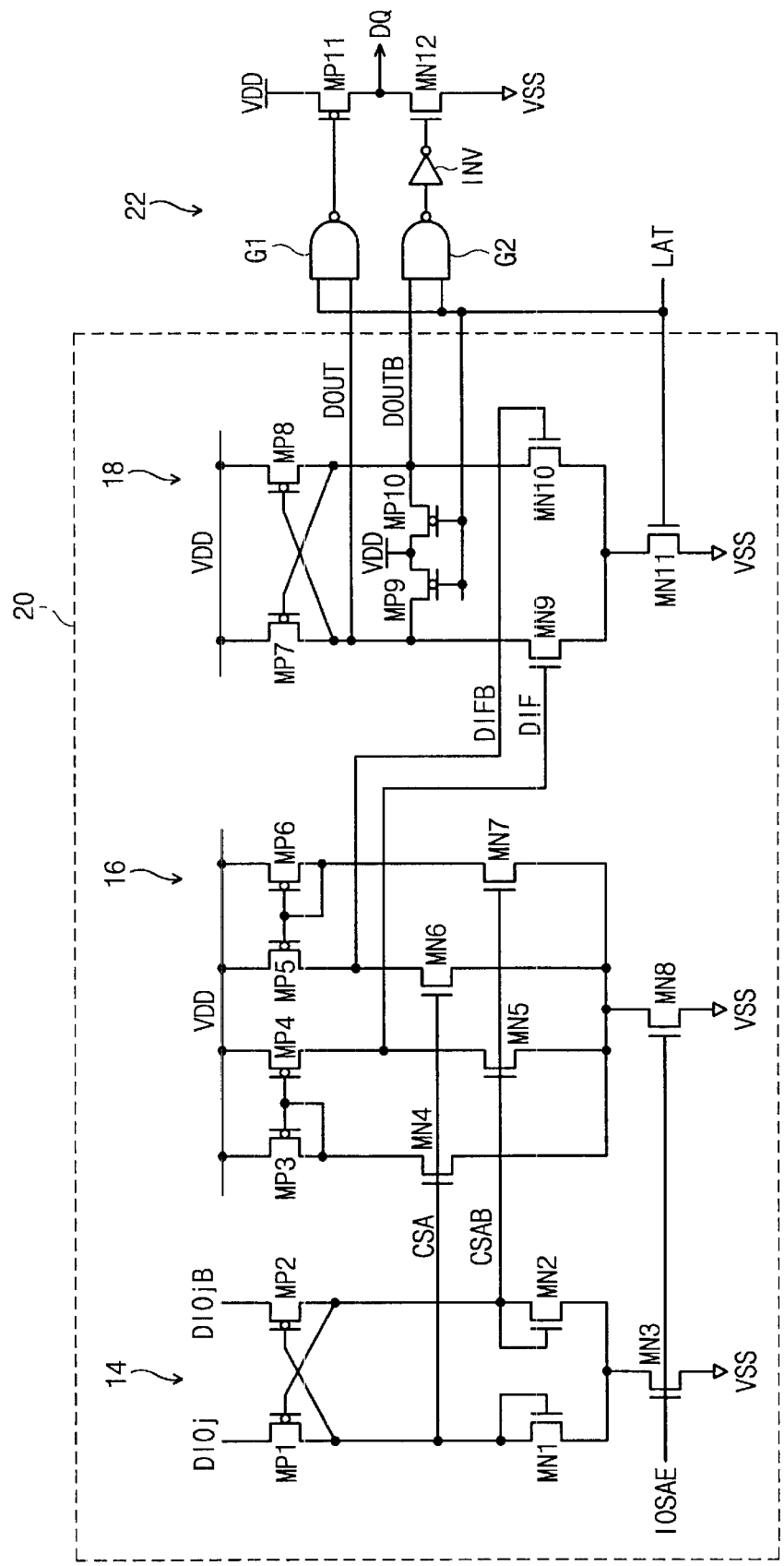
FIG. 2 is a detailed circuit diagram of an input/output sense amplifier illustrated in FIG. 1.
Figure 3:
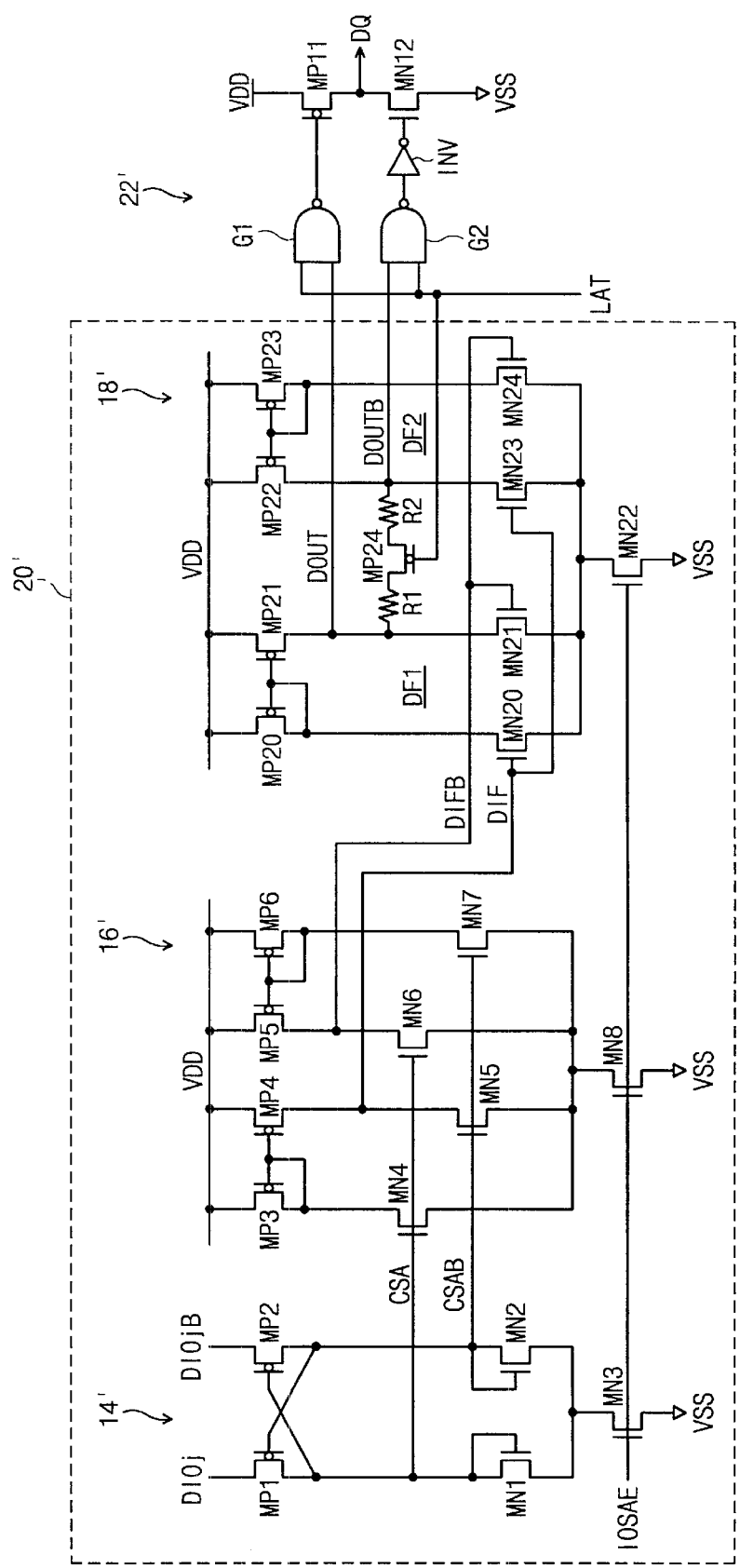
FIG. 3 is a preferred embodiment of an input/output sense amplifier circuit according to the present invention.

The preferred embodiment of the invention will be more fully described with reference to the attached drawings. A preferred embodiment of an input/output sense amplifier circuit according to the present invention is illustrated in FIG. 3 together with an output buffer. In FIG. 3, constituent elements that have identical to those in FIG. 2 are designated by the same reference numerals, and similar elements are similarly designated by primed, but otherwise identical, reference designators.

The input/output sense amplifier circuit 20' according to the present invention is connected to data input/output lines DIOj and DIOjB, and includes a current sense amplifier 14', a voltage sense amplifier 16' and a latch circuit 18'. The current sense amplifier 14' and the voltage sense amplifier 16' according to the present invention perform the same function as those in FIG. 2, and a functional description thereof is thus omitted.

The latch circuit 18' according to the present invention comprises two differential amplifiers DF1 and DF2, each of which consists of two PMOS transistors and three NMOS transistors connected as illustrated in the figure. Each of the differential amplifiers DF1 and DF2 receives signals DIF and DIFB from the voltage sense amplifier 16' at a previous stage as its input signals, and has its output terminals for outputting corresponding output signals DOUT and DOUTB. The latch circuit 18' of the present invention further comprises two resistors R1 and R2 and a PMOS transistor MP24, which form a gain-varying circuit. One end of the resistor R1 is connected to an output terminal DOUT of the differential amplifier DF1, and one end of the resistor R2 is connected to an output terminal DOUTB of the differential amplifier DF2. A source-drain channel of the PMOS transistor MP24 is formed between the other ends of the resistors R1 and R2, and its gate is connected to receive a latch enable signal LAT.

The resistors R1 and R2 and the PMOS transistor MP24 set the a voltage gain of each differential amplifier DF1 and DF2 varied according to the logic level of the signal LAT. That is, when the signal LAT is at a logic low level, the PMOS transistor MP24 is turned on, thus the output terminals DOUT and DOUTB of the latch circuit 18' are electrically connected through the resistors R1 and R2 and the PMOS transistor MP24. An output resistance of each differential amplifier DF1 and DF2 becomes small, so that the voltage gain of each differential amplifier DF1 and DF2 is reduced. For example, the voltage gain of each differential amplifier is "1".

On the other hand, when the signal LAT is at a logic high level, the PMOS transistor MP24 is turned off, thus the output terminals DOUT and DOUTB of the latch circuit 18' are not connected electrically to each other. Since the output resistance of each differential amplifier DF1 and DF2 is increased as compared with a previous state (a connection state of the output terminals), the voltage gain of each differential amplifier DF1 and DF2 is also increased. As a result, the voltage gain of each differential amplifier DF1 and DF2 is capable of being changed according to a turn-off/turn-on state of the PMOS transistor MP24.

Figure 4:
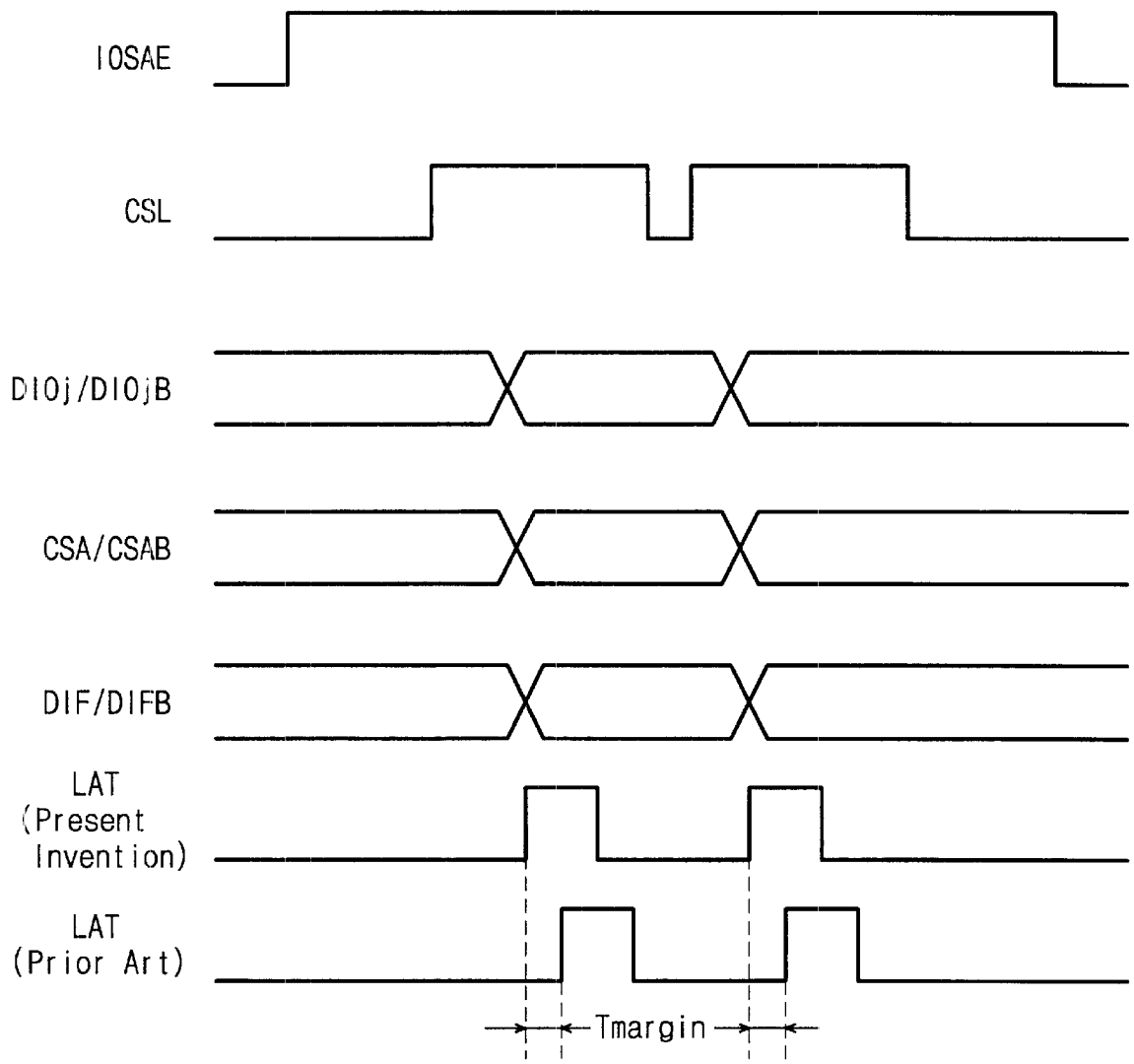
FIG. 4 is a timing diagram for describing an operation of an input/output sense amplifier circuit according to the present invention.

Referring to FIG. 4, a timing diagram for describing an operation of the input/output sense amplifier circuit according to the present invention is illustrated. Below, an operation of the input/output sense amplifier circuit according to the present invention will be described more fully with reference to the accompanying drawings.

When a read operation commences, a word line WLm is selected. Data stored in a memory cell MC, which is connected to the selected word line, is transferred to a bit line BLn/BLnB. A pair of bit lines BLn and BLnB associated with the selected memory cell are connected to corresponding input/output lines IOi and IOiB through transistors T1 and T2, which are selected by a column selection line CSL. The pair of input/output lines is connected to corresponding data input/output lines DIOj and DIOjB through an input/output multiplexer 12. As illustrated in FIG. 4, the current sense amplifier 14', the voltage sense amplifier 16' and the latch circuit 18' of the circuit 20' are activated at a logic high level of the signal IOSAE. Data signals transferred to the data input/output lines DIOj and DIOjB are sensed and amplified by the current sense amplifier 14', and the sensed and amplified data signals CSA and CSAB are sent to the voltage sense amplifier 16'. The voltage sense amplifier 16' again amplifies the data signals CSA and CSAB provided from the current sense amplifier 14'.

When the signal LAT is at a logic low level, the output terminals DOUT and DOUTB of the latch circuit 18' are electrically connected through the resistors R1 and R2 and the PMOS transistor MP24. Thus, the differential amplifiers DF1 and DF2 in the latch circuit 18' have a lower voltage gain. Therefore, the latch circuit 18' outputs the signals DOUT and DOUTB according to logic levels input signals DIF and DIFB, whether valid or invalid. In other words, the latch circuit 18' outputs its output signals DOUT and DOUTB directly proportional to voltage levels of its input signals DIF and DIFB. At this time, since the voltage gain of each of the differential amplifiers DF1 and DF2 is lower, the output signals DOUT and DOUTB do not have a CMOS level. When the signal LAT has a low-to-high transition, the output terminals DOUT and DOUTB of the latch circuit 18' are not connected to each other. Consequently, each of the differential amplifiers DF1 and DF2 operates as an amplifier having a higher voltage gain, thus the voltage levels of the input signals DIF and DIFB are converted to the CMOS level.

Figure 1:
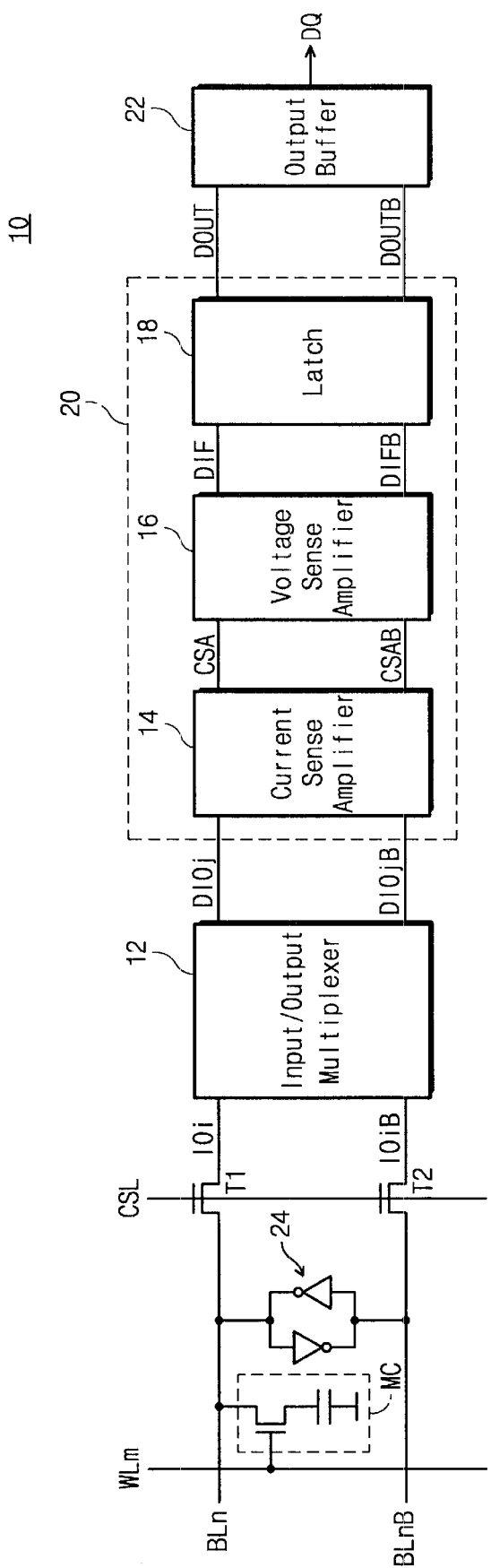
FIG. 1 is a block diagram showing a circuit construction according to a data output path of a conventional dynamic random access memory device.

In a case where such an invalid sensing operation as described above is carried out (or, in a case where the signal LAT is varied too rapidly, whereby previously outputted data signals are applied as input signals of the latch circuit 18'), the output signals DOUT and DOUTB of the latch circuit 18' may be outputted, momentarily, as invalid data. In the latch circuit 18' according to the present invention, however, since the cross-coupled PMOS transistors having a characteristic of maintaining previous data are removed, no time is needed for changing invalid data to current valid data. As a result, no time margin Tmargin of the signal LAT is needed for securing a stable operation (as is required of the latch circuit 18 in FIG. 1). Thus, with the present invention a read time tAA of the DRAM device is shortened.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device comprising at least one pair of bit lines; a pair of input/output (I/O) lines corresponding to the bit lines of the pair; and an I/O sense amplifier circuit coupled to the I/O lines of the pair, wherein the I/O sense amplifier circuit comprises:

a current sense amplifier for sensing a current differential between the input/output lines to output differential signals;

a voltage sense amplifier for amplifying voltages of the differential signals outputted from the current sense amplifier; and a latch circuit for latching the differential signals from the voltage sense amplifier in response to a latch signal, wherein the latch circuit includes a first differential amplifier for receiving the differential signals from the voltage sense amplifier; a second differential amplifier for receiving the differential signals from the voltage sense amplifier; and gain control means coupled between output terminals of the first and second differential amplifiers, the gain control means setting a voltage gain of each of the first and second differential amplifiers that varies in response to the latch signal.

2. The semiconductor memory device according to claim 1, wherein the gain control means comprises:

a first resistive element having one end coupled to the output terminal of the first differential amplifier;

a second resistive element having one end coupled to the output terminal of the second differential amplifier; and a switch transistor coupled between the other ends of the first and second resistive elements, the switch transistor being switched on and off according to a logic level of the latch signal.

3. The semiconductor memory device according to claim 2, wherein the switch transistor is a PMOS transistor.

4. The semiconductor memory device according to claim 3, wherein a voltage gain of each of the first and second differential amplifiers at a logic low level of the latch signal is less than that at a logic high level of the latch signal.

* * * * *